United States Patent [19]
Cronin et al.

[11] Patent Number: 5,836,244
[45] Date of Patent: Nov. 17, 1998

[54] ROTATION SYSTEM FOR CIRCUIT BOARD SCREENER

[75] Inventors: John V. Cronin, Newport Beach; Tan Y. Ly; Peter R. Rose, both of Santa Ana, all of Calif.

[73] Assignee: Circuit Automation, Irvine, Calif.

[21] Appl. No.: 743,873

[22] Filed: Nov. 5, 1996

Related U.S. Application Data

[60] Provisional application No. 60/006,129 Nov. 6, 1995.
[51] Int. Cl.[6] .................................................. B41F 17/00
[52] U.S. Cl. ........................................ 101/123; 101/364
[58] Field of Search .................................... 101/123, 124, 101/157, 169, 350, 364, 367, 423, 425

[56] References Cited

U.S. PATENT DOCUMENTS

| 4,957,044 | 9/1990 | Cronin | 101/35 |
| 5,224,424 | 7/1993 | Layland | 101/425 |
| 5,265,531 | 11/1993 | Cronin | 101/35 |

*Primary Examiner*—Ren Yan
*Attorney, Agent, or Firm*—Fulbright & Jaworski

[57] ABSTRACT

A rotational system to be utilized in conjunction with a vertical screening apparatus, wherein a print head assembly and ink reservoir rotate about a pivot away from the coating chamber in order to allow ready access to the screen chase.

7 Claims, 4 Drawing Sheets

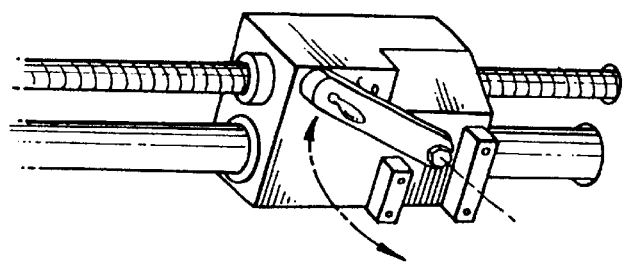
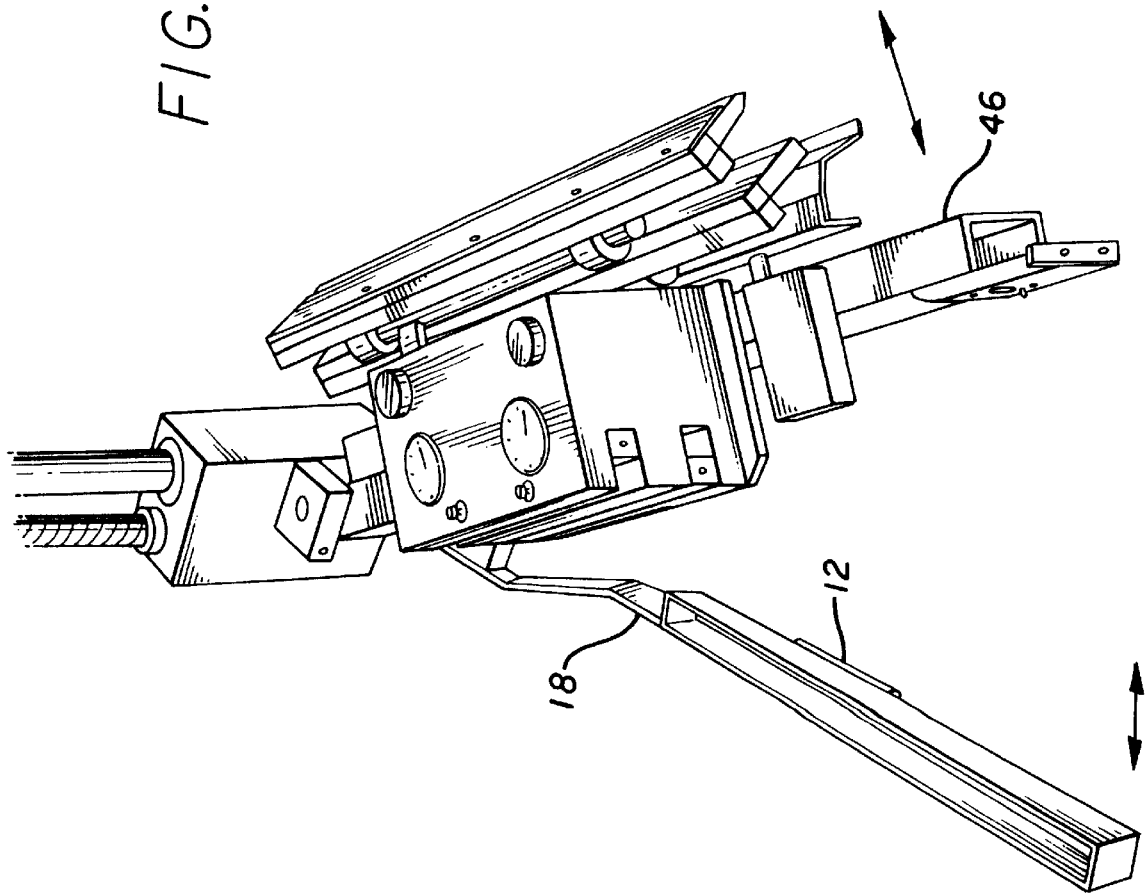
FIG. 4

ROTATION SYSTEM FOR CIRCUIT BOARD SCREENER

CROSS-REFERENCE TO RELATED APPLICATIONS

This application claims the benefit of U.S. provisional application No. 60/006,129 filed Nov. 6, 1995.

FIELD OF THE INVENTION

This invention relates generally to the field of print screening devices. More particularly, the invention relates to the provision of a rotation system capable of rotating a print head assembly (i.e. squeegee and flood blade) and ink reservoir out of the coating chamber so that one can readily access the screen chase for adjustment and maintenance purposes.

BACKGROUND OF THE INVENTION

Photopolymers have found widespread application in the preparation of printed circuit boards and other electronic devices. These materials are applied to circuit boards by screen printing and/or stenciling techniques which are well known in the art. Applicant's prior U.S. Pat. No. 4,404,903 describes a semi-automatic device that uses a horizontal print stroke to print a photoimagable soldermask ink simultaneously on both sides of a board. Applicant's prior U.S. Pat. No. 4,957,044 describes an automatic device that uses vertical flood and print strokes to print photoimagable soldermask ink simultaneously on both sides of a board. Applicant's prior U.S. Pat. No. 5,265,531 describes a reciprocally shuttled double sided screener with tiltable print squeegee assembly capable of printing both sides of a circuit board simultaneously.

U.S. Pat. Nos. 5,265,531 and 4,957,044 both employ common methods of screening a circuit board. In particular, circuit boards are transported into a print zone between two pivotally mounted vertical screens where the boards are printed, and then to an output assembly. Both sides of a board are printed simultaneously by means of flood blades and squeegees operating sequentially to flood the screens with ink and press them into contact with the board. The print head support arm and ink reservoir arm are both bolted to the screen frame, so that in order to access the coating chamber, it is necessary to unbolt the print head support bar and ink reservoir.

Most persons in the business of screening circuit boards work for a large number of different customers, and thus have many different small job orders. Typically, circuit boards are screened in groups of 25 to 50 boards. Each new job order usually involves adjusting the screen chase in order to accommodate a new size of circuit board. Thus, ready access to the screen chase and coating chamber is a common problem in the industry. For example, when a job order comes in for a different size board, the machine needs to be opened up and worked on in order to define the new dimensions of the window of the chase for the new board size. The chases, which hold the screening membranes, have to be adjusted. In order to access the chases, the print head needs to be unbolted and removed, which is a messy, time consuming process. The ink remaining on the print head rubs off and spills over onto various parts of the machine and surroundings. The ink has a viscosity similar to honey, so that when the print head is removed, the remaining ink forms sticky strings that hang from the print head and sticks to various parts of the screening apparatus. This is a problem for many reasons. First, the ink is very expensive, and is about the third highest material cost in producing circuit boards. By having to open up the machine and remove the print heads, a large amount of ink is wasted. Second, adjusting the machine in order to accommodate a new job order takes time and cuts down on the number of circuit boards that can be printed during a set period of time. Third, without speedy access to the work area, the ink has a tendency to dry, which is not only wasteful, but also requires additional time to remove the old ink and replace with fresh ink. Fourth, during the time that the machine is being worked on, the ink that gets all over the machine either dries or accumulates on different parts of the machine, which could cause problems in the accuracy of the next printing.

SUMMARY OF THE INVENTION

The present invention overcomes the foregoing problems by providing a system to rotate the print head and ink reservoir out of the print zone so that one can quickly and easily adjust the machine in order to accommodate a different sized circuit board. Unlike the prior art, such as U.S. Pat. Nos. 5,265,531 and 4,957,044, where the print head support bar, which carries the print head (including the flood blade and one or more squeegees), and the ink trough are bolted into the machine, the present invention provides a hinged arm which rotates about a pivot and allows the print head support bar and an ink reservoir to swing out away from the machine. A lever is provided which, when in closed position, keeps the hinged arm flush against the housing blocks of the squeegee vertical drive system. When the machine needs to be worked on, for either maintenance work or for normal process setup (i.e. redefining a window on the chase or replacing the screen), the lever holding the hinged arm flush against the housing block is rotated to an open position, which allows the print head arm and print head to swing out along a generally horizontal plane away from the coating chamber. Because the flood blade generally resides within the ink reservoir, the ink reservoir swings out in conjunction with the print head arm. In this way, the ink reservoir remains in vertical alignment with the print head arm and acts to contain the ink that drips off the flood blade and print squeegees. The present invention also cuts down on the amount of time it takes to adjust the machine because the print head support bar and the ink reservoir no longer need to be unbolted from the screen frame, thus allowing ready access to the screen chase.

The present invention can be used in conjunction with the squeegee vertical drive system as described in U.S. Pat. Nos. 5,265,531 and 4,957,044, the specifications of which are hereby incorporated by reference. The squeegee vertical drive system is formed by conjunctively mounting opposing flood blades and opposing print squeegees onto cross members. The cross members are slidably attached as hereinafter described, to guide bars, and they are screw driven in a vertical plane by screw systems which are mounted on each of the four corners of a system base plate. Further details of the squeegee vertical drive are described in U.S. Pat. Nos. 5,265,531 and 4,957,044.

The foregoing and additional features and advantages of this invention will become apparent from the detailed description and accompanying drawing figures that follow. In the figures and the written description, numerals indicate the various features of the invention, like numerals referring to like features throughout for both the drawing figures and the written description.

BRIEF DESCRIPTION OF THE DRAWINGS

FIG. 4 is perspective view of the components constituting the print head rotation arm in an open position, along with the ink reservoir arm in an open position, unaligned with the print head arm.

DETAILED DESCRIPTION OF THE INVENTION

Figure 1:
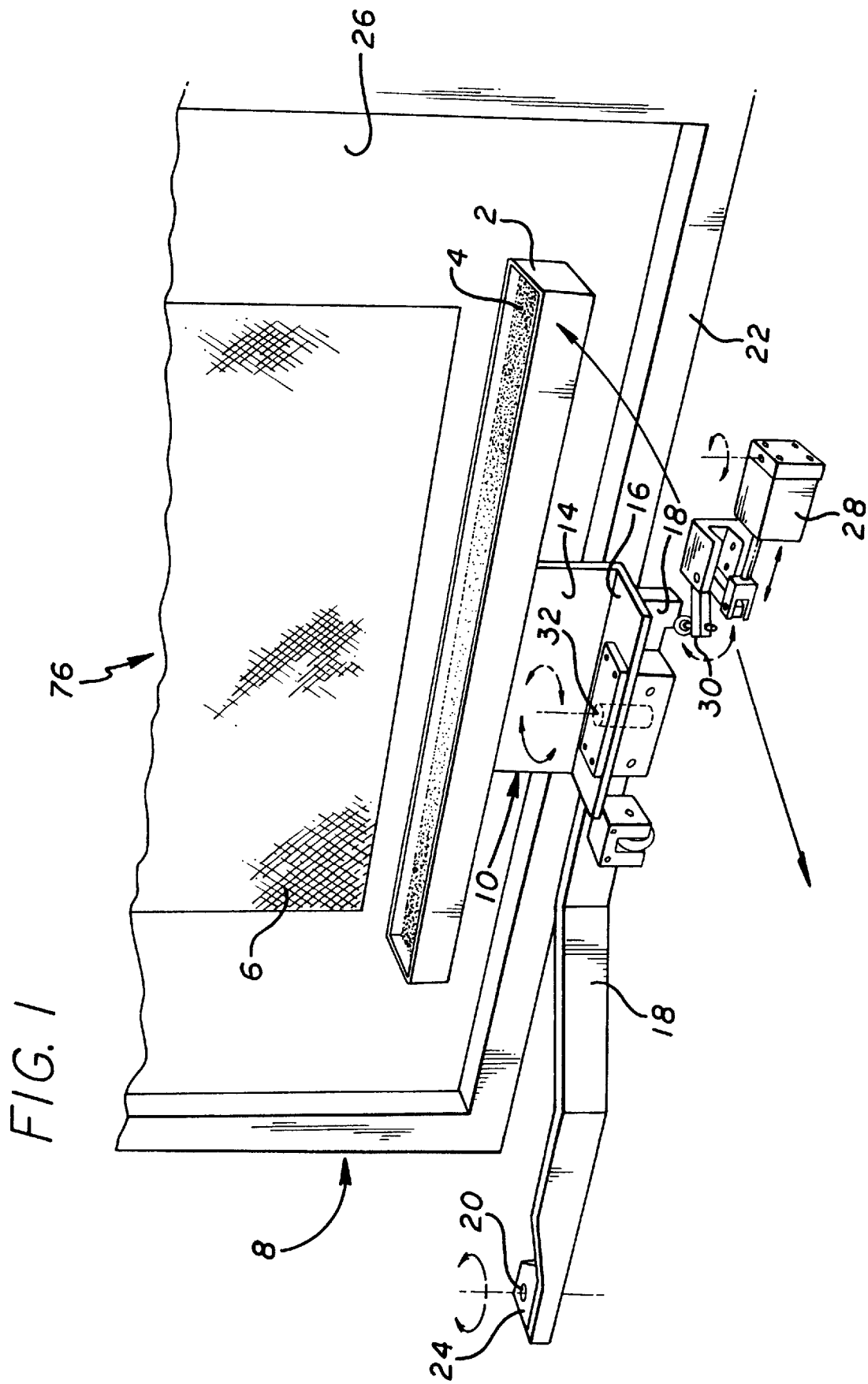
FIG. 1 is a perspective view of the ink reservoir arm in a closed position, omitting the print head for clarity, in accordance with the invention.

Referring to FIG. 1, a system for rotating the print head and ink reservoir out of the coating chamber so that one can quickly and easily adjust the circuit board screening machine in order to accommodate a different sized circuit board is illustrated. In particular, an ink reservoir 2, containing ink 4, is provided so as to be positioned in flush parallel alignment beneath screening membrane 6 (commonly referred to as a screen) within chase 8. During the screening process, the screen 6 is flooded with ink 4. The ink reservoir 2 is connected to the upper generally horizontal plate 12 (shown in FIG. 4) of a rigid member 10. The rigid member 10 is comprised of an upper generally horizontal plate 12 connected to a generally vertical plate 14, which is in turn connected to a lower generally horizontal plate 16. The lower horizontal plate 16 is connected to a rigid ink reservoir arm 18, preferably made of steel, which rotates about pivot 20. The ink reservoir arm 18 is shaped so that when in a closed position (as further described below), it lies flush against the lower portion of the screen 6, then is offset by extending outward at an acute angle, and returns to a plane parallel to the chase frame 22, before it attached to pivot member 24. The ink reservoir 2 is held tight against screen 6 by cylinder 28 which pushes on linkage 30 which in turn pushes against ink reservoir arm 18. The ink reservoir 2 rotates about internal pivot 32 so that it stays in line with the screen 6 when in closed position. Internal pivot 32 allows ink reservoir 2 to remain in flush parallel alignment with screen 6 so as to contain any ink 4 dripping from screen 6.

Figure 2:
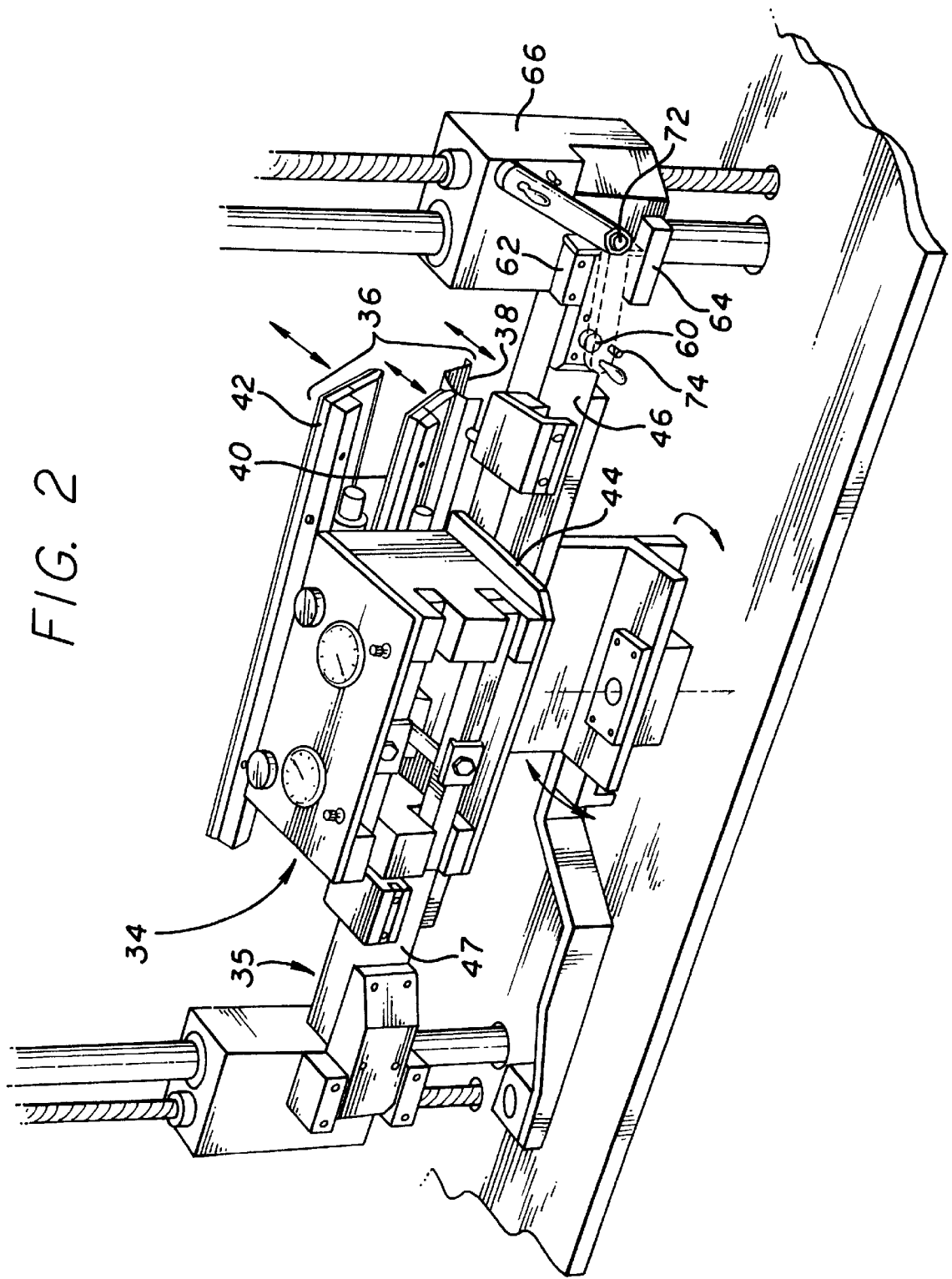
FIG. 2 is a perspective view of the ink reservoir arm and print head arm in a closed, unlocked position, in accordance with the invention.

FIG. 2 shows the ink reservoir arm and print head arm in a closed, unlocked position. The print head 34 is comprised of a squeegee and flood blade assembly 36. In the preferred embodiment shown, the squeegee and flood blade assembly 36 is comprised of a flood blade 38, a print squeegee 40, and a spot suppressor squeegee 42. Many other alternative embodiments of the squeegee and flood blade assembly 36 are possible. For example, the spot suppressor squeegee can be omitted, or a roller could be used in place of the spot suppressor squeegee.

Figure 3:
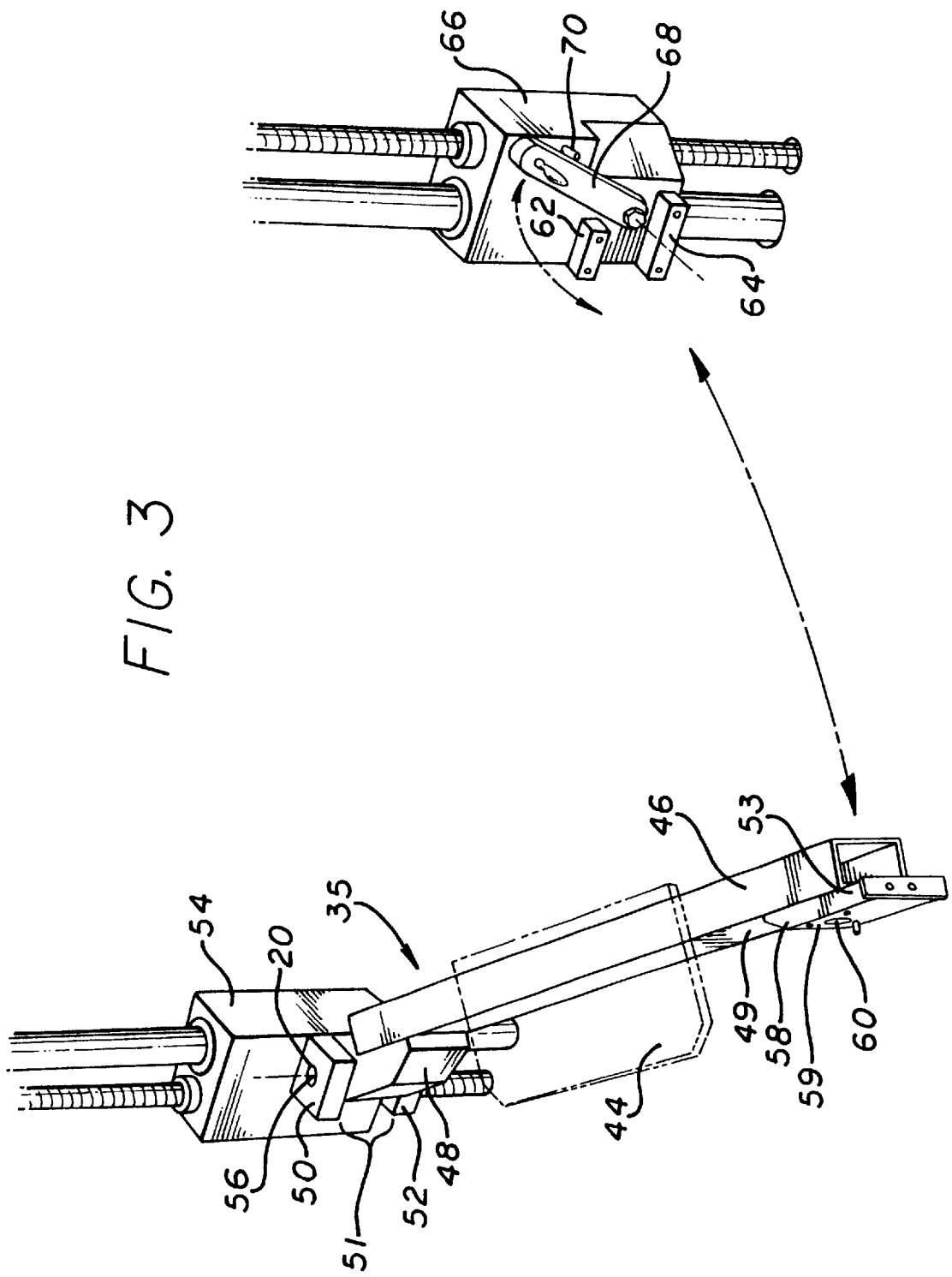
FIG. 3 is a perspective view of the components constituting the print head rotation arm, absent the print head and ink reservoir arm, in an open position.

The print head 34, including the squeegee and flood bar assembly 36, is attached to the upper surface of plate 44. Referring to FIG. 2 in conjunction with FIG. 3, the lower surface of the plate 44 is connected to the upper surface of the print head arm 46. The plate 44 is located generally in the center of the print head arm 46 in order to align the print head 34 with the circuit board (not shown) to be screened. As shown in FIG. 3, one end 35 of the print head arm 46 is pivotally attached to a pivot assembly 51, which includes top and bottom support blocks 50 and 52 and pivot pin 56. In particular, between pivot 20 and plate 44, the front face 47 of print head arm 46 is attached to hinge 48, which is located between the pivot assembly blocks 50 and 52. The blocks 50 and 52 are attached to a housing block 54. A pivot pin 56 is held between the support blocks 50 and 52, thus allowing the print head arm 46 to pivotally rotate about the pivot pin 56.

A scab plate 58 is attached to the other end 49 of the print head arm 46 opposite the pivot assembly 51. A sensor 60 for indicating whether the print head arm 60 is in a closed or open position is located on the front face 59 of scab plate 58. A free end 53 of the scab plate 58 extends beyond the length of the print head arm 46. When the print head arm 46 is locked in a closed position, the scab plate 58 engages the housing block 66 between upper and lower receiving blocks 62 and 64. The receiving blocks 62 and 64 are attached to the housing block 66 and are disposed generally parallel to one another with a space disposed therebetween for receiving the free end 53 of scab plate 58 when the print head arm 46 is in a closed position. A lever 68 is pivotally attached to housing block 66. When the lever 68 is in an open position (FIG. 3), the lever 68 rests against an outer stop 70, which is attached to the front face of the housing block 66.

Referring to FIG. 2, when print head arm 46 is in a closed and locked position (the locked position is shown by dotted lines), the free end 53 of the scab plate 58 lies in intimate contact with the outer surface of the housing block 66. The lever 68 pivots about the pivot pin 72 so that when in a closed and locked position, the lever 68 rests against inner stop 74 extending from scab plate 58. The print head arm 46, when in a closed and locked position, is held in intimate contact with the front face of the housing block 66 by the lever 68. When the lever 68 is in its closed position, the sensor 60 indicates that the print head arm 46 is closed and that the machine is ready to run.

In FIG. 2, the print head arm 46 is shown in the closed and unlocked position. Dotted lines are used to show the print head arm 46 in the closed and locked position. In FIG. 3, the print head arm is in the open position. When the lever 68 pivots into the open position (as indicated by arrows), the print head arm 46 swings out away from coating chamber 76 along a horizontal plane (also indicated by arrows).

In FIG. 4, the ink reservoir arm 18 is in an open position, and unaligned with print head arm 46. While generally, in accordance with the invention, ink reservoir arm 18 remains in vertical alignment with print head arm 46. As shown in FIG. 4, the two arms pivot separately and independently of one another. However, as a practical matter, because the flood blade 38 generally rests within the ink reservoir 2, when the print head arm 46 swings away from the coating chamber 76 (FIG. 1) along a horizontal plane, the ink reservoir arm 18, which freely pivots about the pivot pin 56, swings away from the coating chamber 76 in vertical alignment with the print head arm 46.

It will be appreciated by persons skilled in the art that the present invention is not limited to what has been shown and described hereinabove, nor the dimensions of sizes of the physical implementation described immediately above. The scope of invention is limited solely by the claims which follow.

What is claimed is:

1. In a vertical screening apparatus for simultaneously screening each side of a board with inking material in which two vertically oriented chases are mounted in opposing spaced relationship with respect to each other and an ink reservoir is disposed along the base of each of said chases, and which opposing first and second print heads are verticaly reciprocated through flood and print sequences on opposite sides of the chases, the improvement comprising a rotational assembly with means for rotating said first print head away from said chases, wherein said rotational assembly further comprises means for rotating said ink reservoir away from said chases while maintaining vertical alignment with said first print head, said first print head comprising a flood blade and print squeegee.

2. The improvement according to claim 1, in which said flood blade resides in said ink reservoir while said first print head and said ink reservoir are being rotated away from said chases to maintain said vertical alignment.

3. The improvement according to claim 1 in which said screening apparatus further comprises a print head arm pivotally secured to one side of said screening apparatus, wherein said first print head is carried by said print head arm.

4. The improvement according to claim 3 in which said screening apparatus further comprises an ink reservoir arm pivotally secured to said one side, wherein said ink reservoir is carried by said ink reservoir arm.

5. The improvement according to claim 3 including latching means carried on a side of said apparatus opposite to said one side, said print head arm including means distal from said pivot point for engaging said latching means.

6. The improvement according to claim 5 in which said latching means comprises a scab plate attached to said print head arm to latch said print head arm to said apparatus.

7. In a vertical screening apparatus for simultaneously screening each side of a board with inking material in which two vertically oriented chases are mounted in opposing spaced relationship with respect to each other, an ink reservoir disposed along the base of each of said chases and which opposing first and second print heads are vertically reciprocated through flood and print sequences on opposite sides of the chases, the improvement comprising a rotational assembly with means for rotating said first print head away from said chases and means for rotating said ink reservoir away from said chases while maintaining vertical alignment with said first print head, said first print head comprising a flood blade and print squeegee, wherein said flood blade resides in said ink reservoir while said first print head and said ink reservoir are being rotated away from said chases to maintain said vertical alignment, wherein said screening apparatus further comprises a print head arm pivotally secured to one side of said screening apparatus, wherein said print head is carried by said print head arm, and wherein said screening apparatus further comprises an ink reservoir arm pivotally secured to said one side, wherein said ink reservoir is carried by said ink reservoir arm, and further comprising a latching means carried on a side of said apparatus opposite to said one side, said print head arm including means distal from said pivot point for engaging said latching means, wherein said latching means comprises a scab plate attached to said print head arm to latch said print head arm to said apparatus.

* * * * *